United States Patent [19]
Oda

[11] Patent Number: 5,237,527
[45] Date of Patent: Aug. 17, 1993

[54] PULSE SHAPING FILTER

[75] Inventor: Minoru Oda, Kobe, Japan

[73] Assignee: Mitsubishi Denki Kabushiki Kaisha, Tokyo, Japan

[21] Appl. No.: 798,811

[22] Filed: Nov. 27, 1991

[30] Foreign Application Priority Data

Nov. 29, 1990 [JP] Japan .................. 2-331489

[51] Int. Cl.$^5$ .............................................. G06G 7/02
[52] U.S. Cl. .................................................. 364/825
[58] Field of Search ............... 364/825, 724.01, 724.16, 364/572; 333/165–167

[56] References Cited

U.S. PATENT DOCUMENTS

| | | | |
|---|---|---|---|
| 3,883,727 | 5/1975 | Stuart et al. ..................... | 364/825 X |
| 4,156,914 | 5/1979 | Westell ............................ | 364/825 X |
| 4,293,831 | 10/1981 | Lueder ............................. | 333/165 |
| 5,005,146 | 4/1991 | Lakatos et al. .................. | 364/572 X |

OTHER PUBLICATIONS

A Symp. on Nuclear Electronics 1969 Ispra Italy "Realization of Optimum Pulse Shaping Filter" M. Oda, pp. 43–46.

Primary Examiner—Tan V. Mai
Attorney, Agent, or Firm—Rothwell, Figg, Ernst & Kurz

[57] ABSTRACT

A pulse shaping filter for use in pulse height analysis, wherein a plurality of semi-gaussian filters of different time constants are provided, which generate a plurality of signals of semi-gaussian shape with different pulse widths from one input signal, and added the plurality of signals after delaying them in a manner that the signal of the semi-gaussian filter of the smaller time constant is delayed longer, thereby to obtain a signal of approximately cusp shaping.

4 Claims, 8 Drawing Sheets

Fig. 6

| i (FILTER No.) | Ki | ωi (10⁶ R/sec) | TDi (μsec) |
|---|---|---|---|
| 111 | 1 | 0.641 | 0 |
| 112 | 1 | 0.967 | 0.6 |
| 113 | 1 | 1.396 | 0.9 |
| 114 | 1 | 2.513 | 1.2 |
| 115 | 1/2 | 6.283 | 1.4 |

PULSE SHAPING FILTER

BACKGROUND OF THE INVENTION

1. Field of the Invention

This invention relates to a pulse shaping filter such as a spectroscopy filter to be used for radiation measurement, particularly for energy analysis of radioactive rays.

2. Description of the Related Art

A pulse-height analysis has been conventionally applied to energy analysis of radioactive rays in radiation measurement. The pulse shaping filter is used to obtain the optimum energy resolution for the analysis by improving the S/N ratio of the pulse. The pulse shaping filter mostly suited to the above purpose is a so-called cusp filter which generates a signal of cusp shape from a unit step signal.

This has been widely known from documents entitled "Realization of Optimum Pulse Shaping Filter" (pp. 43-46, theses of Symposium On Nuclear Electronics sponsored by EURATOM, 1969).

FIG. 1 is a structural block diagram of a conventional cusp filter. Referring to FIG. 1, a unit step signal A is inputted to a single integrating circuit 2 and a multiple integrating circuit 4 through an input terminal 1. An integrated signal B outputted from the single integrating circuit 2 is fed to a delay circuit 3 and a delayed signal C from the delay circuit 3 is subtracted by subtractor 5 from an integrated signal D outputted from the multiple integrating circuit 4. A subtracted signal E of the subtractor 5 is then sent to an amplifier 6, and an amplified signal from the amplifier is outputted from an output terminal 7.

The operation of the conventional cusp filter will be discussed below with reference to FIG. 2 showing the waveforms of the above signals A through E.

The single integrating circuit 2 generates the integrated signal B of an exponential shaping from the unit step signal A. On the other hand, the multiple integrating circuit 4 generates the integrated signal D of S shape from the unit step signal A. The integrated signal B is delayed by the delay circuit 3 to be the delayed signal C and when the delayed signal C is subtracted from the integrated signal D (D−C) by the subtractor 5, the subtracted signal E, in other words, the output signal of the cusp shaping filter is obtained.

It is to be noted here that the details of each function and the fact that the maximum S/N ratio is achieved by the function are disclosed in the aforementioned documents.

The conventional cusp filter improves the S/N ratio by approximately 1.02 of NF (noise figure) of the index generally employed in the radiation measurement field, which is considerably close to the theoretical limit 1.00. A semi-gaussian cusp filter which is most widely available among marketable cusp filters at present shows about 1.20 of NF.

Though the basic property of the conventional cusp filter having the above-described structure is excellent to be quite close to the theoretical limit, there exists the following problems since the final subtracted output of such a waveform as E illustrated in FIG. 2 after separately processing the input signal A in the single and multiple integrating circuits 2 and 4. That is because each pulse width of the delayed signal C and integrated signal D before subtraction is wide, which lowers the counting rate characteristic, and the saturation characteristic of each waveform of the signals C and D against the excessive signal A is different from each other, resulting in turbulence of the waveform after the subtraction.

SUMMARY OF THE INVENTION

This invention has been devised to solve the above-discussed problems.

An essential object of this invention is to provide a pulse shaping filter equipped with a plurality of semi-gaussian filters each having a different time constant, wherein an output signal of a semi-gaussian filter with a smaller time constant is delayed longer, thereby to obtain an added waveform of the delayed output signals, so that an inconvenience brought about when the signal waveforms are composed through subtraction is removed by composing the waveforms only through addition.

The above and further objects and features of the invention will more fully be apparent from the following detailed description with accompanying drawings.

BRIEF DESCRIPTION OF THE DRAWINGS

FIG. 6 is a table of example values of time constants used in the semi-gaussian filters.

DESCRIPTION OF THE PREFERRED EMBODIMENTS

A pulse shaping filter embodied by this invention will be depicted with reference to the accompanying drawings.

Figure 1:
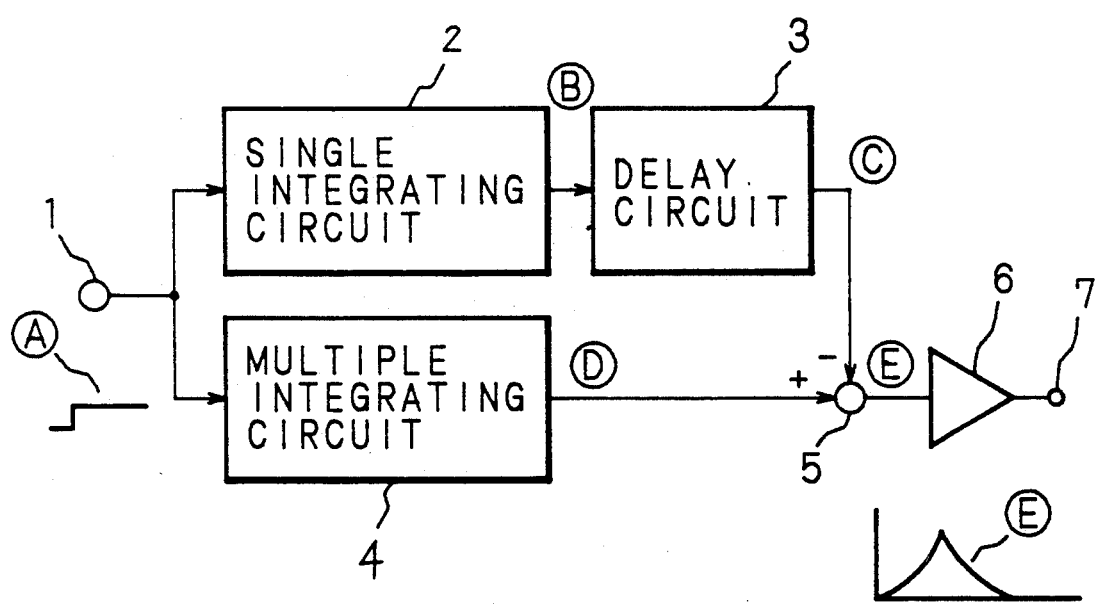
FIG. 1 is a structural block diagram of a conventional cusp filter.
Figure 2:
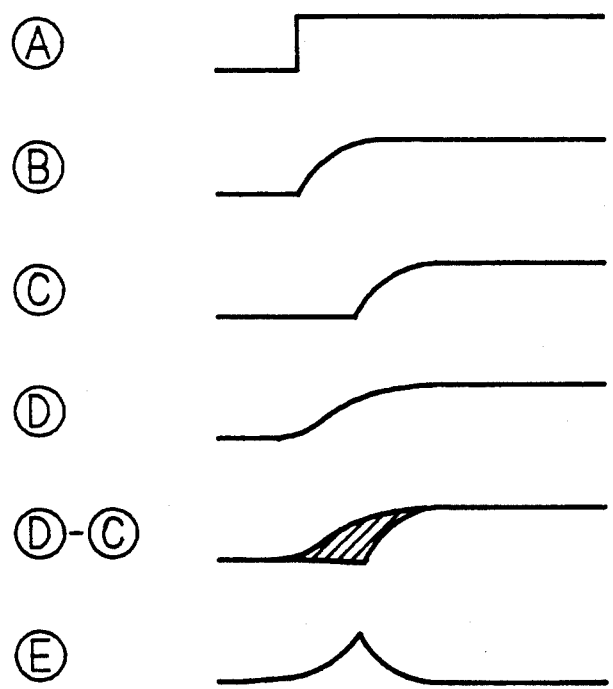
FIG. 2 is a diagram of waveforms of input/output signals in the conventional cusp filter.
Figure 3:
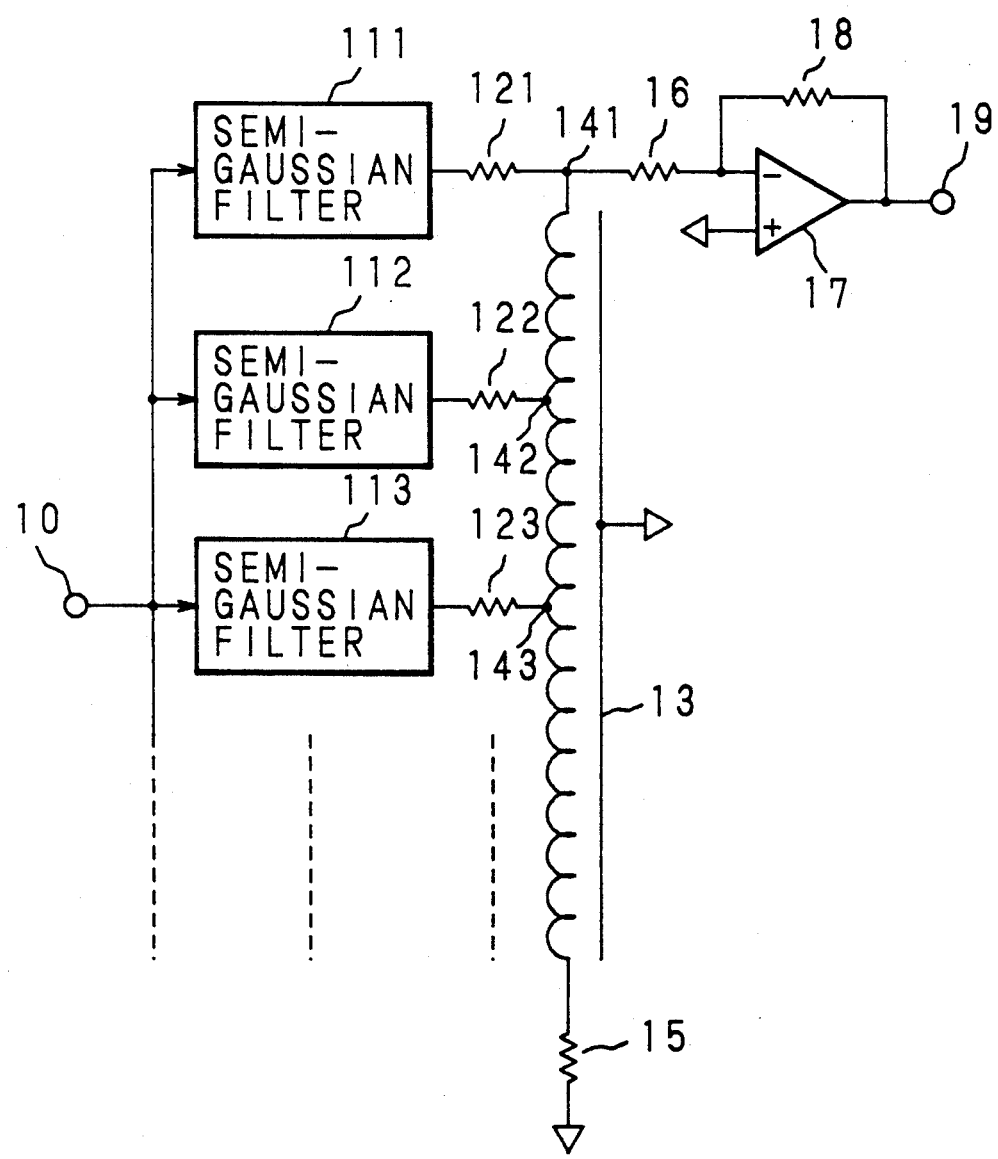
FIG. 3 is a structural block diagram of a pulse shaping filter according to this invention.

The structure of a pulse shaping filter of this invention is shown in a block diagram of FIG. 3. In FIG. 3, a reference numeral 10 represents an input terminal through which a unit step signal is supplied, and reference numerals 111, 112, 113, ... are semi-gaussian filters of different time constants to which the input signal are supplied in common.

Resistors 121, 122, 123, ... are connected to the output sides of the semi-gaussian filters 111, 112, 113, ..., respectively. Outputs of the semi-gaussian filters 111, 112, 113, ... are respectively led to taps 141, 142, 143, ... of a tapped delay line 13 through the resistors 121, 122, 123, ... sequentially from the semi-gaussian filter of a larger time constant. A resistor 15 is connected to one end of the tapped delay line 13 to which a resistor 16 is connected on the output side.

Each delayed signal from the tapped delay line 13 is sent to an amplifier 17 working as adding means. An output terminal and an input terminal of the amplifier 17 are connected to each other through a resistor 18. An amplified signal from the amplifier 17 is outputted from an output terminal 19.

Figure 4:
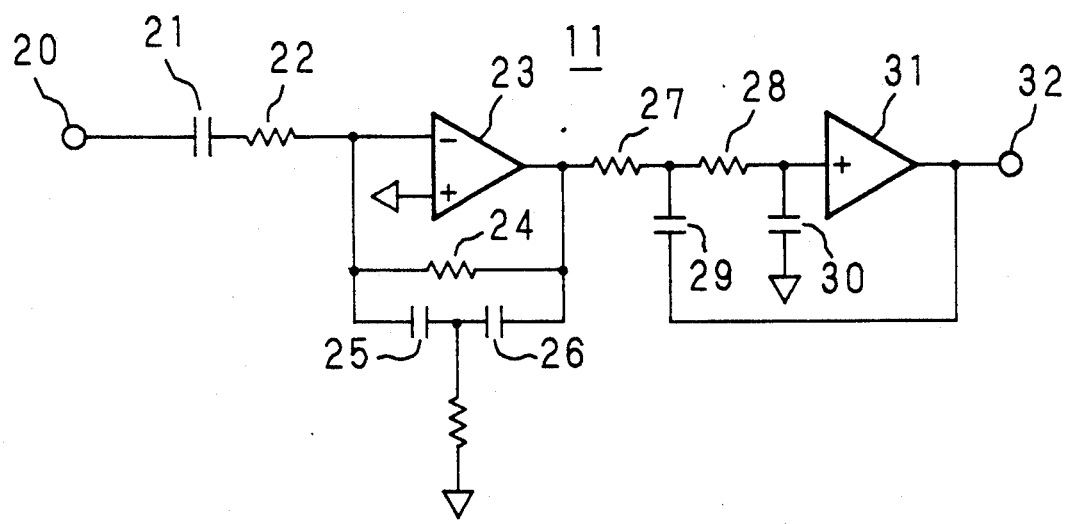
FIG. 4 is a circuit diagram of a semi-gaussian filter used in the pulse shaping filter of this invention.

FIG. 4 is a circuit diagram of an example of a semi-gaussian filter 111, 112, 113, .... An input terminal 20 for a unit step signal inputted through the input terminal 10 is connected to an operational amplifier 23 via a capacitor 21 and a resistor 22. Both a resistor 24 and capacitors 25, 26 are connected in parallel between an input terminal and an output terminal of the operational amplifier 23. An output terminal of the operation amplifier 23 is connected to an amplifier 31 through resistors 27, 28. The junction of the resistors 27 and 28 is connected to an output terminal of the amplifier 31 via a capacitor 29. Moreover, the junction of the resistor 28 and amplifier 31 is connected to a capacitor 30. An output from the amplifier 31 is outputted from an output terminal 32.

Next, the operation of the pulse shaping filter of this invention will be described below.

A unit step signal inputted through the input terminal 10 is converted to semi-gaussian waveforms by the semi-gaussian filters 111, 112, 113, ..., and respectively sent to the corresponding taps 141, 142, 143, ... of the tapped delay line 13 through the resistors 121, 122, 123, ....

Figure 5A:
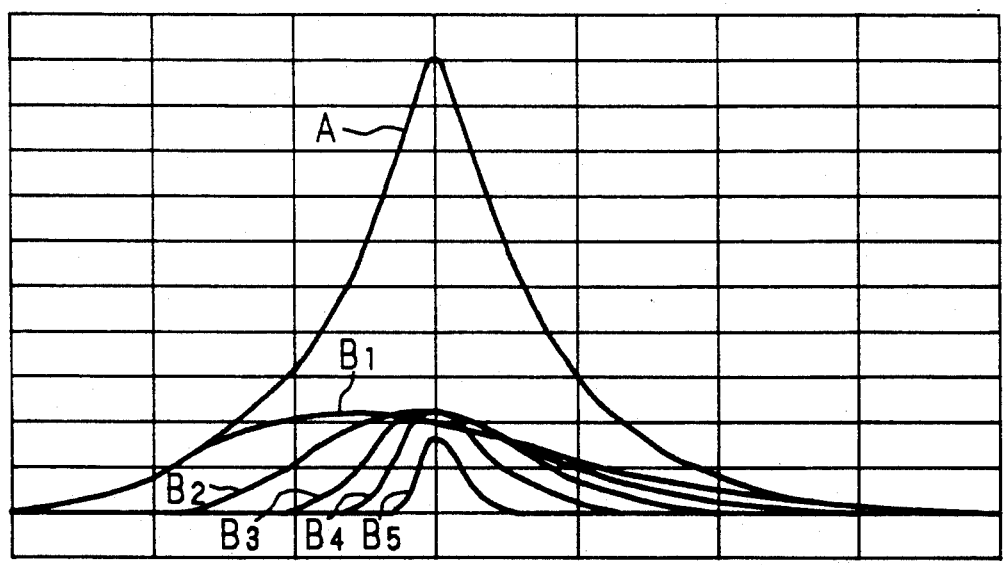
FIG. 5(a) through (c) are diagrams of waveforms of output signals of the pulse shaping filter of this invention together with the output signals of individual semi-gaussian filters.

FIG. 5(a) shows waveforms of the outputted signals of the pulse shaping filter of this invention and semi-gaussian filters 111, 112, 113, ... with each delay. The response waveform of the semi-gaussian filter in the instant embodiment design indicated in FIG. 4 to the unit step signal are represented by an equation (1) below.

$$f(t,\omega i) = Ki(\sin \tfrac{1}{2}\omega it - \tfrac{1}{3}\sin \tfrac{3}{2}\omega it)e^{-\omega it} \qquad (1)$$

wherein Ki is a gain of an (i)th semi-gaussian filter and $\omega i$ is an inverse number of a time constant, that is, an angular frequency of the pass band of the (i) the semi-gaussian filter.

The larger the number of the semi-gaussian filter 111, 112, 113, ... is, the smaller the time constant is. The tapped delay line 13 delays longer a semi-gaussian waveform of a smaller time constant. Each delayed signal is added by the amplifier 17. As a result, after a plurality of semi-gaussian waveforms having different time constants and different delay times are added, the semi-gaussian waveforms change to a waveform of an approximately cusp shaping. The signal of this approximately cusp shaping is outputted from the output terminal 19.

FIG. 5(a) shows how the above-mentioned adding of the waveforms $B_1, B_2, \ldots, B_5$ constitutes an approximately cusp shaping waveform A. In FIG. 5(a), five semi-gaussian filters 111, 112, ..., 115 are used. By adding the semi-gaussian waveforms $B_1, B_2, \ldots, B_5$ of the filters 111, 112, ..., 115, the approximately cusp shaping waveform A is obtained eventually.

Figure 5B:
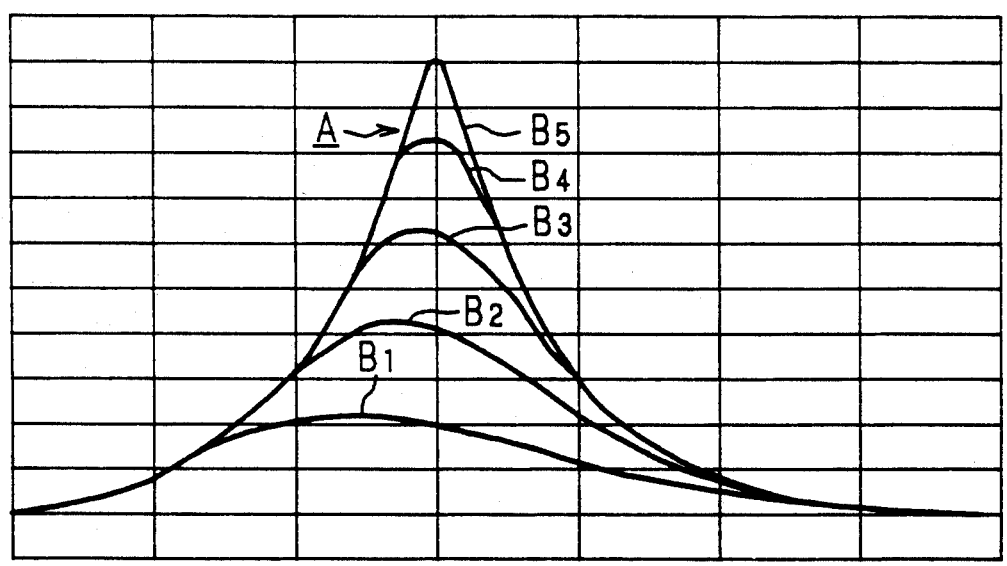

The adding process will be readily understood from FIG. 5(b) wherein the waveforms are added sequentially from the one of a larger time constant and a shorter delay time.

Figure 5C:
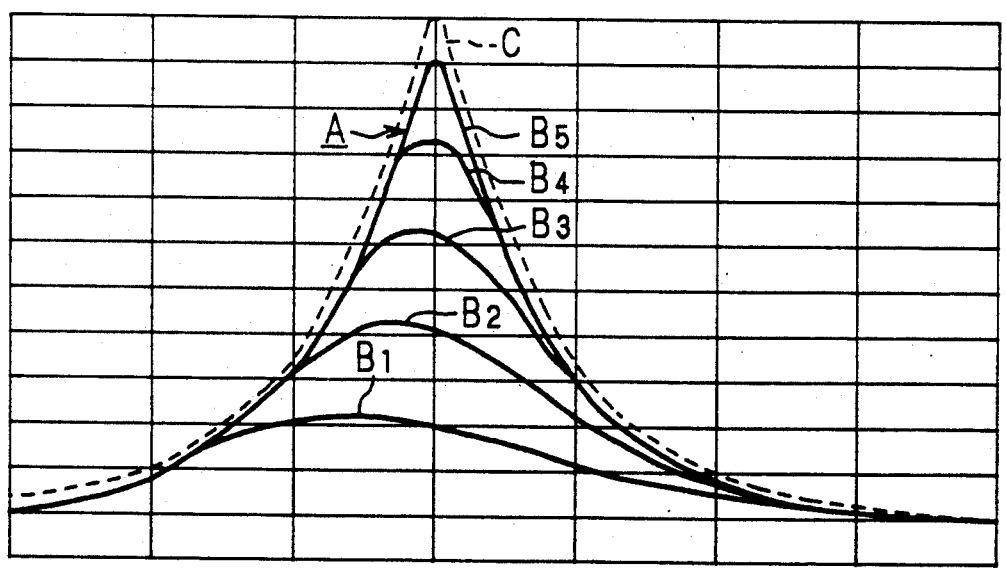

In FIG. 5(c), a waveform C of a perfect cusp shaping is accompanied with the waveform A so as to make clear the approximation accuracy of the approximately cusp shaping waveform A of the present embodiment.

The NF of the semi-gaussian filter of the embodiment is 1.025 which is considerably close to the theoretical limit of 1.00 of a perfect cusp filter, and therefore the pulse shaping filter of this invention has high efficiency.

FIG. 6 is a list of example values of the gain Ki, angular frequency $\omega i$ in the pass band and delay time TDi of the semi-gaussian filters 111, 112, ..., 115 in the above equation (1).

As is discussed hereinbefore, the pulse shaping filter of this invention eliminates an inconvenience encountered when the waveforms are composed by the subtraction and increases the degree of freedom in composition of the waveforms, whereby a favorable approximately cusp shaping waveform is easily and stably obtained. Moreover, the pulse shaping filter of this invention is able to attenuate the trailing edge of the waveform faster than the waveform of a simple exponential shaping, so that the pulse-height resolution at high counting rate becomes better than that of a theoretical perfect cusp filter. Accordingly, the performance characteristic of the pulse shaping filter of this invention is quite close to the theoretical limit of the perfect filter.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A pulse shaping filter which comprises:
   a plurality of semi-gaussian filters having output signals and different time constants, wherein a common signal is inputted to said filters;
   delay means for delaying longer an output signal of the semi-gaussian filter which has a smaller time constant; and
   adding means for adding a plurality of said output signals of said semi-gaussian filters, including the output signal delayed by said delay means, thereby to obtain an output signal of an approximately cusp shaping.

2. A pulse shaping filter according to claim 1, wherein said delay means is a delay line with a plurality of taps.

3. A pulse shaping filter according to claim 1, wherein the delay means delays a plurality of the output signals of said semi-gaussian filters.

4. A pulse shaping filter according to claim 1, wherein said adding means adds output signals from each of said semi-gaussian filters.

* * * * *